(12) United States Patent  (10) Patent No.: US 7,978,340 B2
Boesser et al.  (45) Date of Patent: Jul. 12, 2011

(54) SYSTEM AND METHOD FOR DETERMINING POSITIONS OF STRUCTURES ON A SUBSTRATE

(75) Inventors: Hans-Artur Boesser, Breidenbach (DE); Wolfgang Fricke, Netphen (DE); Michael Heiden, Woelfershelm (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 469 days.

(21) Appl. No.: 12/221,145

(22) Filed: Jul. 31, 2008

(65) Prior Publication Data

US 2009/0033508 A1 Feb. 5, 2009

(30) Foreign Application Priority Data

Aug. 3, 2007 (DE) .................. 10 2007 036 813

(51) Int. Cl.
*G01B 11/02* (2006.01)
*G08B 21/00* (2006.01)
(52) U.S. Cl. ........................ 356/500; 340/626
(58) Field of Classification Search .................. 356/498, 356/500; 73/31.04; 137/12, 14; 340/626
See application file for complete search history.

(56) References Cited

U.S. PATENT DOCUMENTS

| 5,469,260 | A | 11/1995 | Takagi et al. | |
| 5,909,276 | A * | 6/1999 | Kinney et al. | 356/237.2 |
| 6,267,131 | B1 | 7/2001 | Masada et al. | |
| 6,580,087 | B1 | 6/2003 | Suzuki et al. | |
| 7,196,507 | B2 * | 3/2007 | Schneidewind et al. | 324/750.16 |
| 7,817,262 | B2 * | 10/2010 | Ehrenberg et al. | 356/237.2 |
| 2004/0035851 | A1 | 2/2004 | Antoniou et al. | |
| 2005/0134839 | A1 | 6/2005 | Kreh et al. | |
| 2007/0085986 | A1 | 4/2007 | Okada | |

FOREIGN PATENT DOCUMENTS

| DE | 19628969 C1 | 10/1997 |
| DE | 19949005 A1 | 5/2001 |
| DE | 103 59 722 A1 | 7/2005 |
| DE | 102005052757 A1 | 5/2007 |

OTHER PUBLICATIONS

Dieter Adam, et al., First Measurement Data Obtained on the New Vistec LMS IPR04, Proc. of SPIE, vol. 6533, 653001-7 (2007), 23rd European Mask and Lithography Conference.

Bläsing, Dr. Carola, "Pattern Placement Metrology for Mask Making," Wetzlar, Germany, Mar. 31, 1998.

* cited by examiner

*Primary Examiner* — Michael A Lyons
(74) *Attorney, Agent, or Firm* — Simpson & Simpson, PLLC

(57) ABSTRACT

A system and a method for determining positions of structures on a substrate are disclosed. The system includes at least one measurement table (20) movable in the X-coordinate direction and in the Y-coordinate direction, a measurement objective (9) and a camera for determining the positions of the structures (3) on the substrate (2). The position of the measurement objective (9) and/or the measurement table (20) may be determined by at least one interferometer (24). The system is surrounded by a housing representing a climatic chamber (50) provided with an active pressure regulation.

7 Claims, 5 Drawing Sheets

SYSTEM AND METHOD FOR DETERMINING POSITIONS OF STRUCTURES ON A SUBSTRATE

CROSS REFERENCE TO RELATED APPLICATIONS

This patent application claims priority of German Patent Application No. 10 2007 036 813.7, filed on Aug. 3, 2007, the application is incorporated herein by reference.

FIELD OF THE INVENTION

The present invention relates to a system and method for determining positions of structures on a substrate.

BACKGROUND OF THE INVENTION

A climatic chamber essentially serves for regulating temperature and humidity. Although a coordinate measuring machine is accommodated in a climatic chamber, variations of the air pressure still influence the measurement result of the interferometers determining the position of the measurement objective and the measurement table with respect to a coordinate system. The influence of pressure variations of the ambient pressure is not attenuated by the climatic chamber.

A measuring device for measuring structures on wafers and/or masks is disclosed in the lecture script "Pattern Placement Metrology for Mask Making" by Dr. Carola Bläsing. The lecture was given on the occasion of the Semicon conference, Education Program, in Geneva on Mar. 31, 1998. It describes a coordinate measuring machine in detail. It also mentions that the coordinate measuring machine is accommodated in a climatic chamber regulating the temperature <±0.01° C. and the humidity to <±1% of relative humidity. It also discloses a laser interferometer with which the position of the measurement table within the X/Y plane may be determined. An etalon is used for determining the variations of temperature and humidity.

German patent DE 196 28 969 also discloses a coordinate measuring device and also discusses the problems caused by climatic air pressure changes and air humidity changes, also after opening doors of the climatic chamber, and thus influencing the wavelength of the light used for obtaining measurement results. In order to solve these problems, a double-beam interferometer with effectively reduced influence of the wavelength changes on the position measurement is disclosed. This is achieved by inserting a transparent, closed, incompressible body into the optical reference path or the optical measurement path so that the portions of the optical reference path and the optical measurement path located outside the body have the same length for a certain positioning of the movable measurement table. For this purpose, the measurement table is provided with a reflecting surface at a certain location.

U.S. Pat. No. 5,469,260 discusses the influence of fast, random air movements, such as they occur after opening or closing doors or after movements in the vicinity of the measuring device. The localized air pressure variations caused thereby result in local changes of the refractive index and thus wavelength changes in the light beam. The problem is suggested to be solved by casing the optical measurement and reference paths in tubes that are open at both ends. Air with a defined temperature stabilization or temperature-stabilized gas is to be blown into the tubes. Tubes with a telescope-like extension mechanism are suggested for the optical measurement path that is variable in length. By casing most of the light beam, the influence of fast air pressure variations is mostly prevented.

German published application DE 19949005 discloses a means and a method for introducing various transparent substrates into a high-precision measuring device. The system is accommodated in a climate-controlled chamber.

German published application DE 10 2005 052 757 A1 discloses a device for measuring the position of an object with a laser interferometer system. The at least one laser interferometer system is accommodated in a climate chamber together with the object. The climate chamber has air intake apertures in one area and several air exhaust apertures in another area. There are further provided means in the climate chamber to direct at least part of the flow through the climate chamber out of the area of the laser axes of the at least one laser interferometer system during operation. However, the document does not discuss the problems of measurement accuracy or reproducibility of the measurement results if they are influenced by pressure variations of the ambient air.

U.S. Pat. No. 6,267,131 discloses a method for controlling the pressure in a chamber. It discloses a method for controlling the pressure in a chamber, wherein the pressure is to be kept at a constant pressure in a chamber where the measurement with a laser is performed. The pressure level in the chamber is to exceed ambient pressure. For this purpose, the ambient air pressure is measured. A pressure level significantly above the transient pressure variations of the ambient air pressure is set. Air is introduced into the chamber to reach the predetermined pressure level.

U.S. Patent Application 2007/0085986 discloses an exposure device and a method for correcting the instrumentation of the exposure device. The air pressure in the exposure device is measured, and optical parameters, such as wavelength or lenses, are then set accordingly based on the measurement results to correct the error caused by the change in air pressure.

U.S. Pat. No. 6,580,087 discloses an inspection device. There are provided two blowers blowing a sufficient flow of cleaned air into the inspection device. However, this device does not serve for achieving a constant pressure level or a pressure level above ambient air pressure.

The article "First Measurement Data Obtained On The New Vistec LMS IPRO4". Proc. of SPIE vol. 6533, no. 653301, 7 pages, January 2007, by Dieter Adam et al. discusses the problem of the reproducibility of measurements. It only discusses that temperature and humidity have to be much better controlled in the climatic chamber surrounding the measuring means.

Unfortunately, the previous prior art systems require complex systems or elements to eliminate the changes of the measurement wavelengths caused by air pressure variations.

FIG. 1 is a schematic drawing of a prior art coordinate measuring device Several coordinate measurement devices 1 of the type shown in FIG. 1 are known from prior art. For the sake of completeness, the operation and arrangement of the individual elements of the coordinate measuring device 1 are described. The coordinate measuring device 1 includes a measurement table 20 arranged to be movable on air bearings 21 in a plane 25a in the X-coordinate direction and in the Y-coordinate direction. The plane 25a is formed of an element 25. It is known to make element 25 of granite. The position of the measurement table 20 is measured by means of at least one laser interferometer 24 emitting a light beam 23 for the measurement. The element itself is positioned on vibration dampers 26 to thus keep building vibrations away from the measuring device.

Substrate 2 carrying the structures 3 to be measured is deposited on the measurement table 20. The substrate 2 may be illuminated with a transmitted light illumination means 6 and/or an incident light illumination means 14. The light of the transmitted light illumination means 6 reaches the substrate 2 via a deflecting mirror 7 and a condenser 8. Similarly, the light of the incident light illumination means 14 reaches the substrate 2 via a measurement objective 9. The measurement objective 9 is provided with an adjusting means 15 which allows adjusting the measurement objective 9 in the Z-coordinate direction. The measurement objective 9 collects the light coming from the substrate 2 and directs it out of the incident light illumination axis 5 by means of a partially transmitting deflecting mirror 12 and directs it to a camera 10 provided with a detector 11. The detector 11 is connected to a computer system 16 generating digital images from the measurement values determined by the detector 11.

SUMMARY OF THE INVENTION

It is an object of the present invention to provide a system for determining coordinates and structures on a substrate that enables elimination of the influence of air pressure variations on the measurement result of the position of the structures.

The above object is achieved by a system for determining positions of structures on a substrate including: at least one measurement table movable in the X-coordinate direction and in the Y-coordinate direction; a measurement objective; a camera for determining the positions of the structures on the substrate; at least one interferometer for determining the position of the measurement objective and/or the measurement table with respect to a coordinate system; a housing representing a climatic chamber surrounding the system; an active control means associated with the climatic chamber so that the air pressure within the climatic chamber is set at a defined, constant level above the current ambient air pressure at least for the duration of the measurement of a substrate; and a display via which a warning is output to the user of the system in case the ambient air pressure rises above a level of air pressure within the climatic chamber which is set to be constant, while a substrate is measured.

It is further an object of the present invention to provide a method with which the air pressure conditions, temperature and humidity in a climatic chamber are set such that the influence of the air pressure variations on the measurement of the position of the structures is eliminated for the determination of coordinates and structures on a substrate.

The above object is achieved by a method for determining positions of structures on a substrate including the steps of: determining the ambient air pressure surrounding the climatic chamber; keeping the air pressure within the climatic chamber at a constant level above the ambient air pressure surrounding the climatic chamber at least for the duration of at least one measurement of at least one substrate; and outputting a warning to the user of the system if the ambient air pressure rises above the level of the air pressure within the climatic chamber, which is set to be constant, while a substrate is measured.

In one embodiment, the system is surrounded by a housing representing a climatic chamber. The climatic chamber is provided with an active regulation for the air pressure within the climatic chamber.

Advantageously, the method determines the air pressure of the environment surrounding the climatic chamber. Also, the air pressure within the climatic chamber is kept at a constant level above the ambient air pressure surrounding the climatic chamber at least for the duration of at least one measurement of at least one substrate. Furthermore, the temperature may be regulated to better than 10 mK with the help of the climatic chamber. The climatic chamber also regulates the relative humidity to better than 2%.

Advantageously, the system enables setting the air pressure within the climatic chamber to a defined, constant level above the current ambient air pressure for at least the duration of the measurement of a substrate.

There is a positive pressure within the housing so that pressure variations of the ambient air surrounding the housing of the climatic chamber do not influence the pressure conditions inside the climatic chamber. In particular, an increasing ambient air pressure may be compensated by the positive pressure.

A magazine for substrates and/or a loading station for substrates is provided in the housing. In one embodiment, a transport means is provided in the housing between the loading station and the magazine and/or the measurement table so that the substrates can be transported to the corresponding stations within the housing.

At least one loading aperture is formed in the housing of the climatic chamber. Substrates may, for example, be manually introduced into the housing via the loading aperture. In one embodiment, a transfer interface is formed on the housing which is approachable by an automatic loading system for substrates. Thus the substrates can be introduced into the housing automatically.

When executing the method, the development of the ambient air pressure is checked after every measurement of a substrate. Based on the development of the ambient air pressure, a decision is made as to whether the level of the positive pressure, which is constant during each measurement, is to be raised or lowered.

A further advantage of a present invention system and method is that a warning is output to the user if the ambient air pressure rises above the level of the air pressure within the climatic chamber, which is set to be constant, while a substrate is measured. The users themselves decide whether the currently conducted measurement will be repeated.

Each time before a measurement of a substrate is started, the ambient air pressure and the set level of air pressure in the climatic chamber are checked. The level of air pressure in the climatic chamber is automatically adapted so that there is no unnecessarily high positive pressure in the climatic chamber.

The level of positive pressure in the climatic chamber is kept at a constant level above the current ambient air pressure for all measurements of a batch of substrates.

These and other objects and advantages of the present invention will be readily appreciable from the following description of preferred embodiments of the invention and from the accompanying drawings and claims.

BRIEF DESCRIPTION OF THE DRAWINGS

The nature and mode of operation of the present invention will now be more fully described in the following detailed description of the invention taken with the accompanying drawing figures, in which.

DETAILED DESCRIPTION OF THE INVENTION

At the outset, it should be appreciated that like drawing numbers on different drawing views identify identical, or functionally similar, structural elements of the invention. While the present invention is described with respect to what is presently considered to be the preferred aspects, it is to be understood that the invention as claimed is not limited to the disclosed aspects.

Furthermore, it is understood that this invention is not limited to the particular methodology, materials and modifications described and as such may, of course, vary. It is also understood that the terminology used herein is for the purpose of describing particular aspects only, and is not intended to limit the scope of the present invention, which is limited only by the appended claims.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

Figure 2:
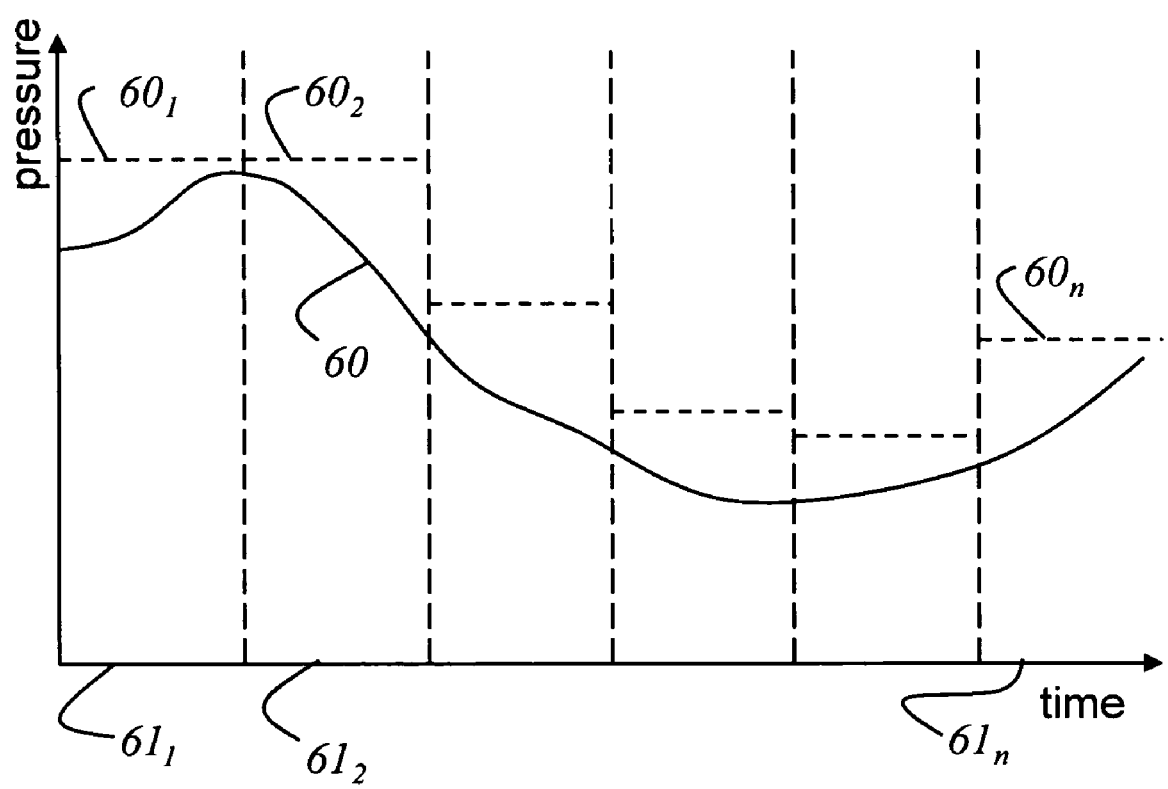
FIG. 2 is a schematic representation of behavior of ambient air pressure and the adaptation of the level of air pressure in a present invention climatic chamber.

FIG. 2 is a schematic representation of behavior of ambient air pressure and the adaptation of the level of air pressure in a present invention climatic chamber.

Figure 1:
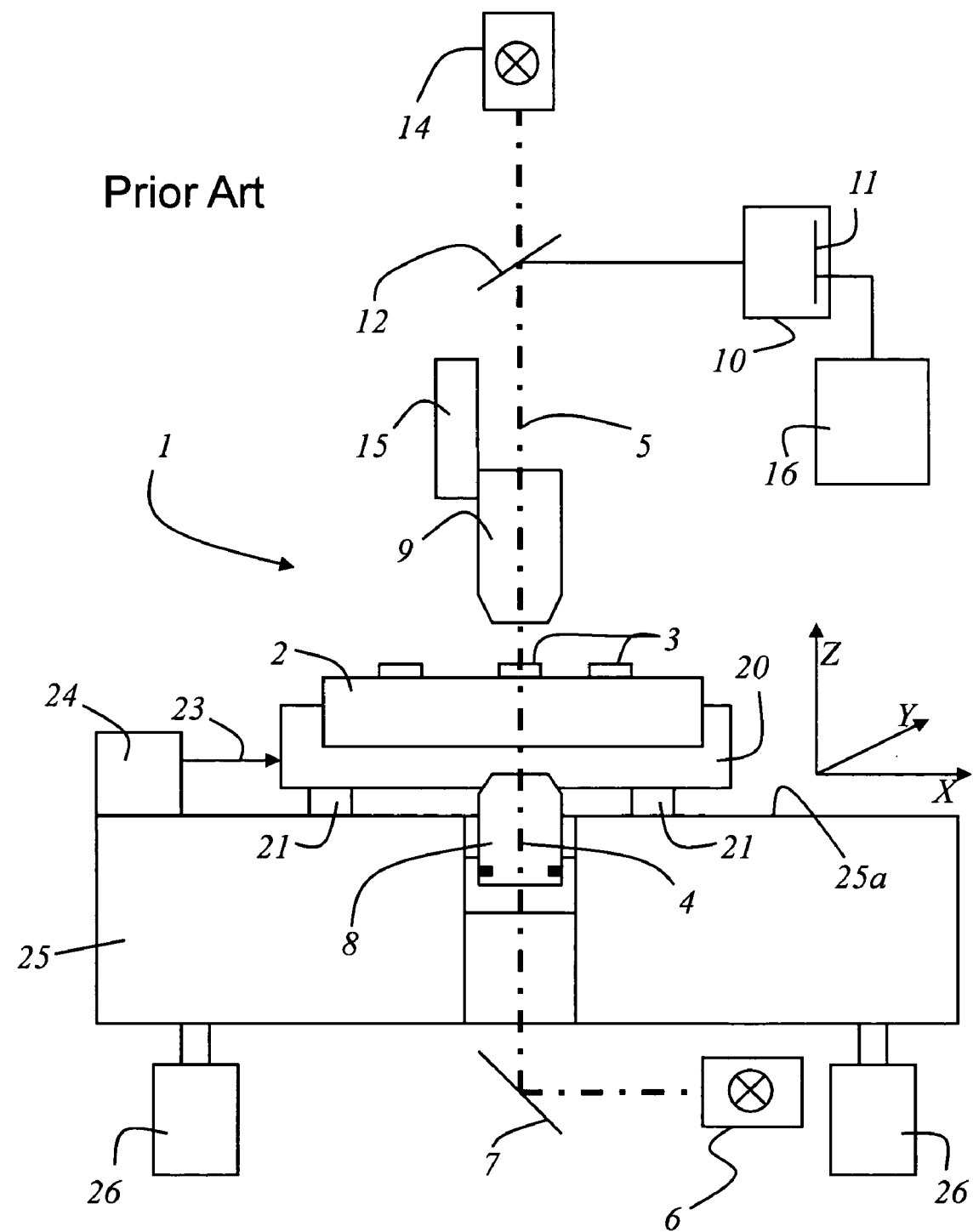
FIG. 1 is a schematic drawing of a prior art coordinate measuring device.
Figure 3:
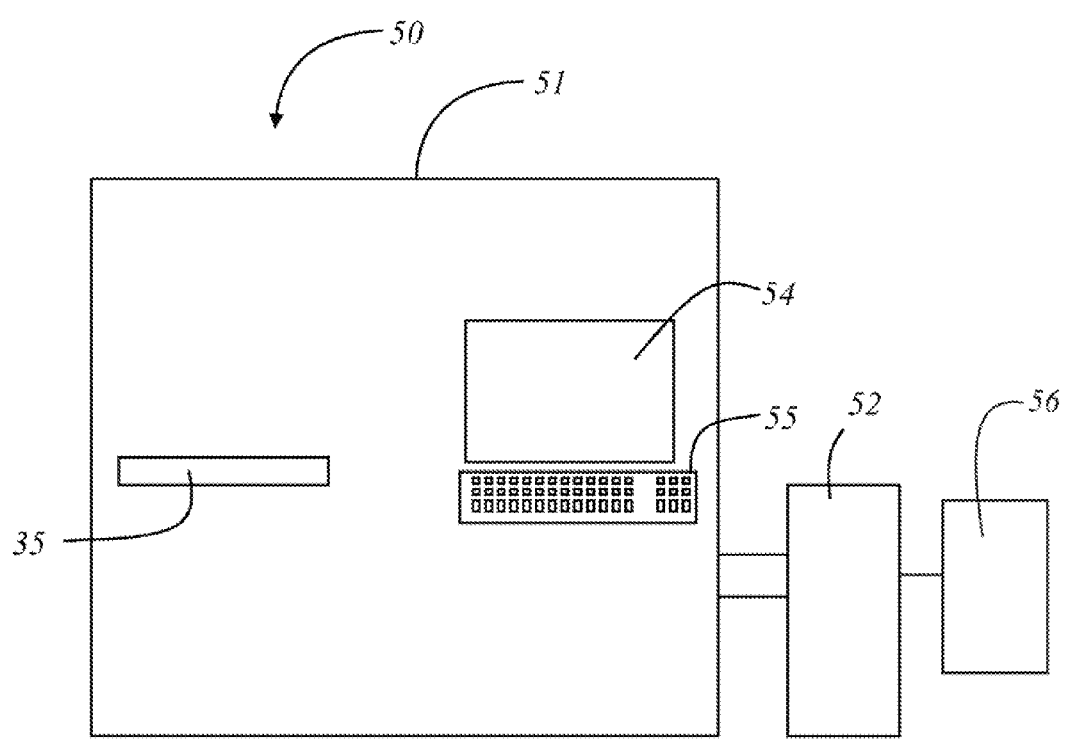
FIG. 3 is a schematic front view of a housing arranged around a present invention coordinate measuring device.

FIG. 3 is a schematic front view of a housing arranged around present invention coordinate measuring device 50. The following should be viewed in light of FIGS. 2 and 3. A present invention climatic chamber can be used with any known coordinate measuring device known in the art, for example, device 1 shown in FIG. 1. FIG. 2 shows a schematic behavior 60 of the ambient air pressure and the adaptation of the level $60_n$ of air pressure in climatic chamber 50. As a non-limiting example, chamber 50 is used with device 1 and for the n measurements $61_1, 61_2, \ldots 61_n$ of n substrates 2, the ambient air pressure is also monitored by measuring means 56. Based on the measurement of the ambient air pressure surrounding the climatic chamber 50, a constant level of air pressure $60_1, 60_2, \ldots 60_n$ within the climatic chamber 50 may be defined for each of the n measurements of n substrates 2. Although, in the representation shown in FIG. 2, a different level of air pressure is set for each of the measurements, it is clear for one skilled in the art that a level of positive pressure that is constant over several measurements or a constant level of positive pressure in the climatic chamber 50 for all measurements of a batch of substrates also is possible. The embodiment of the method shown in FIG. 2 is not to be considered as limiting the invention. The time interval required for the execution of the measurements on a substrate 2 is represented by the distance between the broken lines shown in FIG. 2. Although the time intervals are equal in the chosen representation, it should be understood that other and different time intervals are within the spirit and scope of the claimed invention.

Chamber 50 includes housing 51. Active control means 52 is connected to housing 51 of climatic chamber 50. The active control means allows establishing an appropriate positive pressure within the housing of the climatic chamber so that variations of the ambient air pressure surrounding housing 51 do not affect the measurement results or the elements or light beams required for the acquisition of measurement results by a measuring device, for example, device 1, within chamber 50. By means of the housing of the climatic chamber, the pressure in the chamber is thus kept at a constant level above the ambient pressure. In one embodiment, the housing of the climatic chamber is provided with display 54 via which a user may obtain information on the measuring process of the coordinate measuring machine, for example, device 1, inside the housing. There is also provided input unit 55 via which corresponding commands or recipes for measuring substrate, for example, substrate 2, inside housing 51 of the climatic chamber 50 may be invoked or created.

Figure 4:
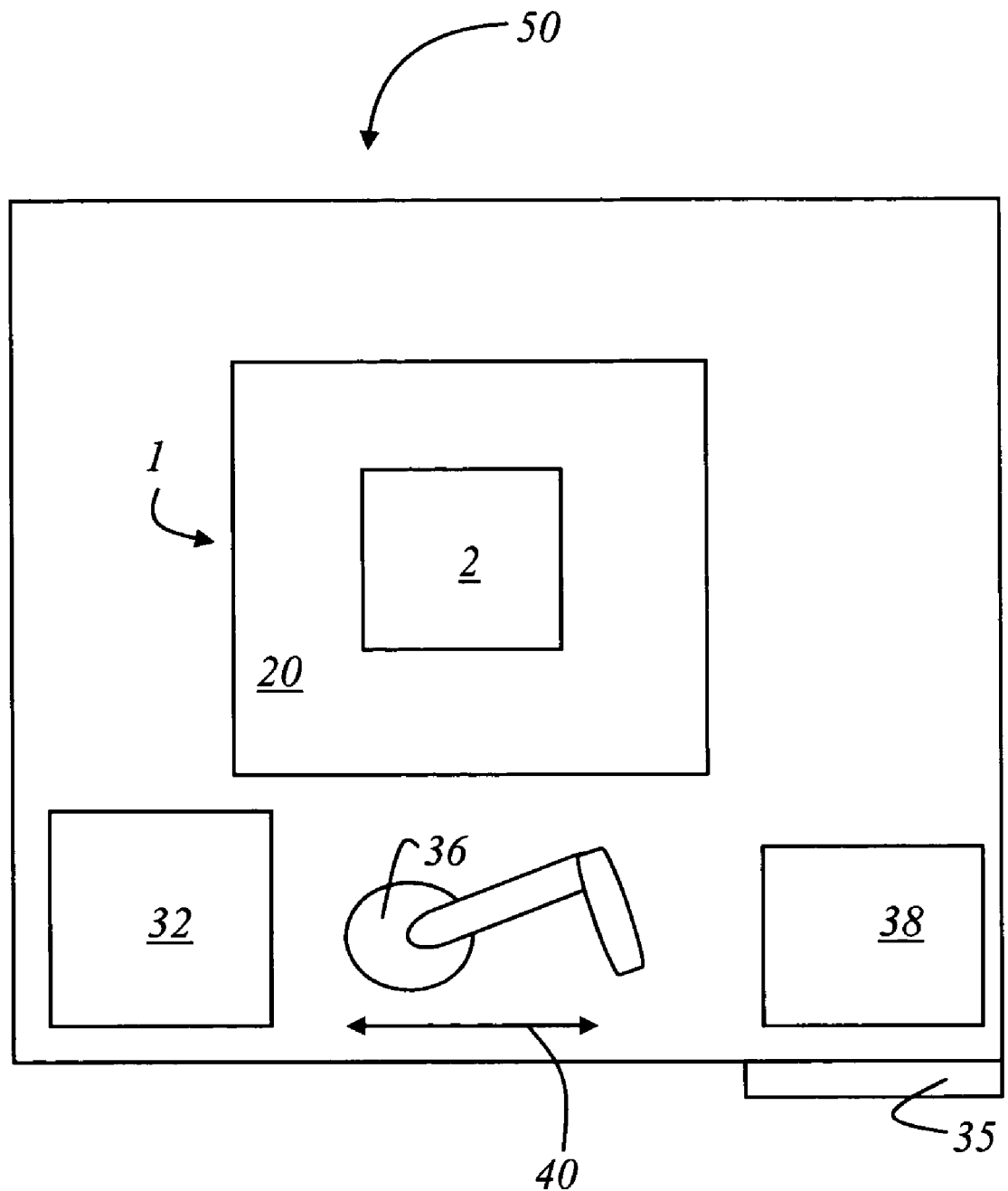
FIG. 4 is a schematic top view of the present invention system shown in FIG. 3, with a measuring device.

FIG. 4 is a schematic top view of the present invention system shown in FIG. 3, with a measuring device. A measuring device, for example, device 1, is placed in chamber 50 for determining coordinates of structures on a substrate. FIG. 4 shows a schematic arrangement of individual measurement stations inside the housing for chamber 50. The coordinate measuring device, for example, device 1, is shown only schematically by the representation of measurement table 20 and substrate 2 positioned on measurement table 20. Magazine 32 where substrates 2 are to be measured may, for example, be stored for temperature adaptation may, for example, be arranged within housing 51 of the climatic chamber. Similarly, substrates 2 already measured may be stored in the magazine before the substrates are output again via loading aperture 35. The loading aperture has loading station 38 associated therewith via which the substrates may be input into the system or into housing 51 of the climatic chamber 50. Transport means 36 capable of moving along the double arrow 40 is arranged between the loading station 38, the magazine and the coordinate measuring machine. With the help of transport means 36, the substrates may be transported to the individual stations or elements within housing 51. It is clear for one skilled in the art that the loading apertures for the substrates are designed to be closable. This configuration ensures that sufficient positive pressure is generated within housing 51 of climatic chamber 50 by the active pressure regulation (as shown in FIG. 2) and also that the positive pressure is kept constant.

Figure 5:
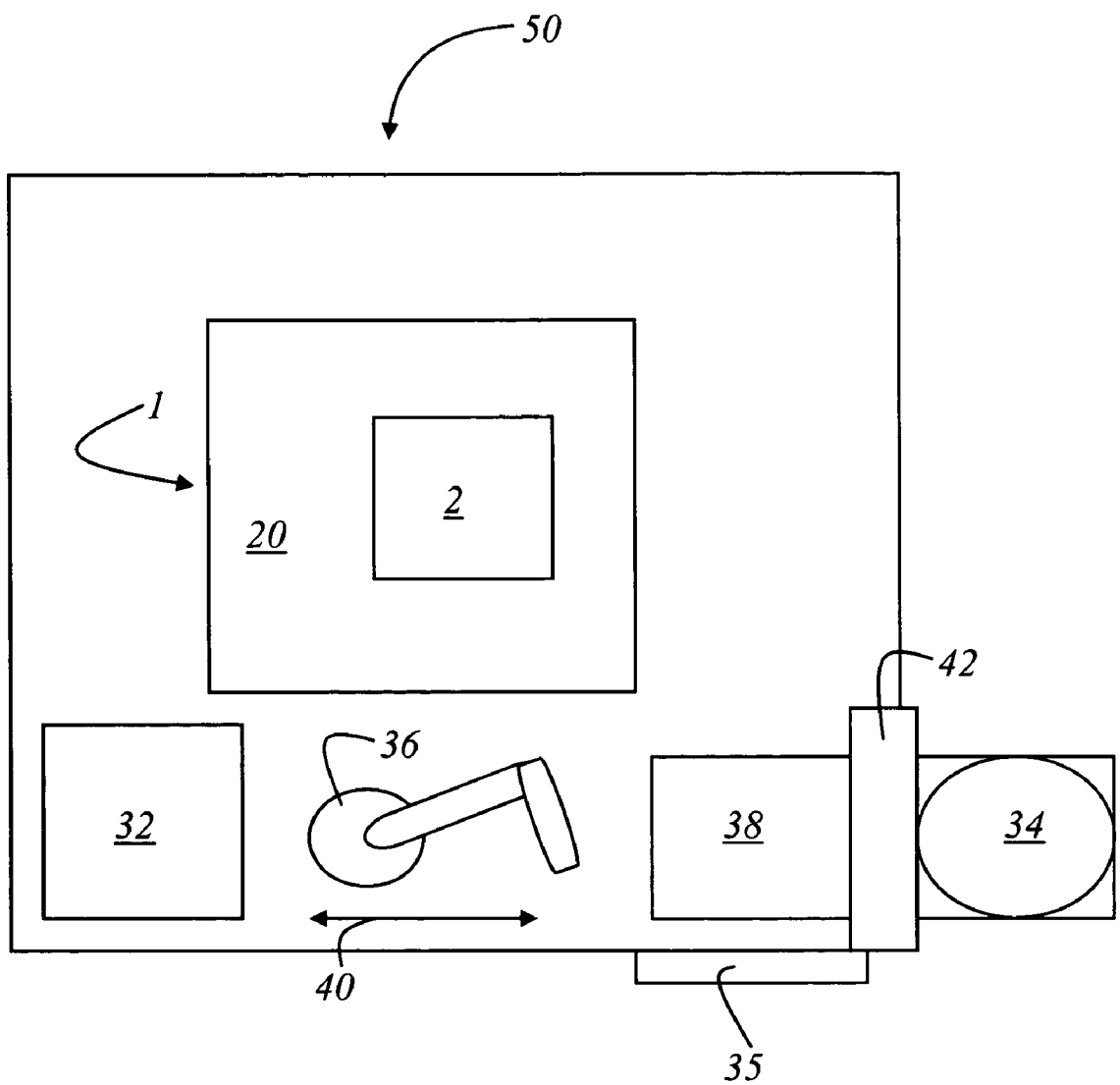
FIG. 5 is a schematic top view of the present invention system shown in FIG. 3, with a measuring device.

FIG. 5 is a schematic arrangement of the present invention system shown in FIG. 3, with a measuring device. A measuring device, for example, device 1, is placed in chamber 50 for determining coordinates of structures on a substrate. For reasons of clarity, active pressure regulation is not shown in FIG. 5. The housing of climatic chamber 50 is connected to interface 42 to which automatic loading system 34 may be connected. Thus several substrates may be transported one after the other into housing 51 of the climatic chamber via the automatic loading system. In one embodiment, the same pressure exists in automatic loading system 34, securely connected to the housing 51 of climatic chamber 50, as it is generated by the automatic pressure regulation in the housing of climatic chamber 50.

What is claimed is:

1. A system for determining positions of structures on a substrate comprising:
   at least one measurement table movable in the X-coordinate direction and in the Y-coordinate direction;
   a measurement objective;
   a camera for determining the positions of the structures on the substrate; at least one interferometer for determining the position of the measurement objective and/or the measurement table with respect to a coordinate system;
   a housing representing a climatic chamber surrounding the system;
   a magazine for substrates and/or a loading station for substrates is provided in the climatic chamber, wherein a transport means is provided in the housing, which transports the substrates between the loading station and/or the magazine and/or the measurement table;

an active control means associated with the climatic chamber so that for a duration of a measurement of a substrate, an air pressure within the climatic chamber is set at a single, defined, constant level with respect to a current ambient air pressure; and a display via which a warning is output to the user of the system in case the ambient air pressure rises above a the constant level within the climatic chamber, while the substrate is measured.

2. The system of claim 1, wherein the air pressure within the climatic chamber above the ambient air pressure is maintained within the climatic chamber so that air pressure variations of the ambient air surrounding the climatic chamber do not have any influence on the pressure conditions inside the housing.

3. The system of claim 1, wherein at least one loading aperture is formed in the housing of the climatic chamber.

4. The system of claim 1, wherein at least one transfer interface is formed on the climatic chamber, where an automatic loading system for substrates is attachable.

5. A method for determining positions of structures on a substrate, wherein there are provided at least one measurement table movable in the X-coordinate direction and in the Y-coordinate direction, a measurement objective and a camera for determining the positions of the structures on the substrate and at least one interferometer for determining the position of the measurement objective and/or the measurement table with respect to a coordinate system, that the system is surrounded by a housing representing a climatic chamber, and a magazine for substrates and/or a loading station for substrates is provided in the climatic chamber, wherein a transport means is provided in the housing, which transports the substrates between the loading station and/or the magazine and/or the measurement table, comprising the steps of:

measuring ambient air pressure surrounding the climatic chamber;

during a duration of a measurement of a substrate, keeping an air pressure within the climatic chamber at a single, constant level with respect to a measured ambient air pressure surrounding the climatic chamber;

outputting a warning to the user of the system if the ambient air pressure rises above the level of the constant level of the air pressure within the climatic chamber while a substrate is measured; and repeating, in response to a user's decision, the currently conducted measurement.

6. The method of claim 5, wherein the ambient air pressure and the set level of air pressure in the climatic chamber are checked each time before a measurement of a substrate is started, so that the level of air pressure in the climatic chamber is automatically adapted so that there is no unnecessarily high positive pressure in the climatic chamber.

7. The method of claim 5, wherein the air pressure in the climatic chamber is kept at a constant level with respect to a current ambient air pressure for all measurements of a batch of substrates.

* * * * *